(12) United States Patent
Kim et al.

(10) Patent No.: US 9,048,236 B2
(45) Date of Patent: Jun. 2, 2015

(54) SEMICONDUCTOR DEVICE AND METHOD OF FABRICATING THE SAME

(71) Applicant: Samsung Electronics Co., Ltd., Suwon-si (KR)

(72) Inventors: Ju-Youn Kim, Suwon-si (KR); Jong-Mil Youn, Yongin-si (KR); Jong-Joon Park, Hwaseong-si (KR); Kwang-Yong Jang, Yongin-si (KR); Jun-Sun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 13/947,411

(22) Filed: Jul. 22, 2013

(65) Prior Publication Data
US 2014/0103441 A1    Apr. 17, 2014

(30) Foreign Application Priority Data

Oct. 15, 2012 (KR) .......................... 10-2012-0114276

(51) Int. Cl.
| | | |
|---|---|---|
| *H01L 29/51* | (2006.01) | |
| *H01L 27/088* | (2006.01) | |
| *H01L 29/78* | (2006.01) | |
| *H01L 29/49* | (2006.01) | |
| *H01L 29/66* | (2006.01) | |
| *H01L 21/8234* | (2006.01) | |

(52) U.S. Cl.
CPC ............ *H01L 29/518* (2013.01); *H01L 27/088* (2013.01); *H01L 29/78* (2013.01); *H01L 29/4966* (2013.01); *H01L 29/517* (2013.01); *H01L 29/66545* (2013.01); *H01L 21/82345* (2013.01); *H01L 21/823462* (2013.01)

(58) Field of Classification Search
CPC .............. H01L 27/088; H01L 2924/00; H01L 27/0207; H01L 29/78; H01L 21/823807
USPC ...................... 257/368, 411, 330, 369, E29.25
See application file for complete search history.

(56) References Cited

U.S. PATENT DOCUMENTS

| | | |
|---|---|---|
| 2005/0263802 A1 | 12/2005 | Kimizuka et al. |
| 2006/0237804 A1 | 10/2006 | Chau et al. |
| 2007/0102767 A1 | 5/2007 | Cho et al. |
| 2007/0281405 A1 | 12/2007 | Luo et al. |
| 2008/0036008 A1 | 2/2008 | Hirase et al. |
| 2008/0050880 A1 | 2/2008 | Abou-Khalil et al. |
| 2008/0067187 A1 | 3/2008 | Rudick et al. |
| 2008/0116530 A1 | 5/2008 | Hyun et al. |
| 2008/0286916 A1 | 11/2008 | Luo et al. |
| 2009/0072312 A1 | 3/2009 | Chang et al. |
| 2009/0087974 A1* | 4/2009 | Waite et al. .................. 438/592 |
| 2010/0102395 A1 | 4/2010 | Yamamoto et al. |

(Continued)

FOREIGN PATENT DOCUMENTS

| | | |
|---|---|---|
| JP | 2000307010 | 11/2000 |
| JP | 2003045995 | 2/2003 |

(Continued)

*Primary Examiner* — Chuong A Luu
*Assistant Examiner* — Rodolfo Fortich
(74) *Attorney, Agent, or Firm* — Onello & Mello, LLP.

(57) ABSTRACT

A semiconductor device includes an interlayer insulating film formed on a substrate, the insulating layer including a trench. A gate insulating layer is formed on a bottom surface of the trench and a reaction prevention layer is formed on the gate insulating layer on the bottom surface of the trench. A replacement metal gate structure is formed on the reaction prevention layer of the trench to fill the trench.

18 Claims, 8 Drawing Sheets

(56) References Cited

U.S. PATENT DOCUMENTS

| | | |
|---|---|---|
| 2010/0127336 A1 | 5/2010 | Chambers et al. |
| 2010/0159684 A1 | 6/2010 | Chang et al. |
| 2011/0068369 A1 | 3/2011 | Cheng et al. |
| 2011/0207314 A1 | 8/2011 | Niimi et al. |
| 2011/0210403 A1 | 9/2011 | Teo et al. |
| 2011/0215409 A1 | 9/2011 | Li et al. |
| 2011/0241118 A1 | 10/2011 | Ng et al. |
| 2011/0260258 A1 | 10/2011 | Zhu et al. |
| 2011/0260262 A1 | 10/2011 | Yin et al. |
| 2011/0272767 A1 | 11/2011 | Yin et al. |
| 2011/0298061 A1 | 12/2011 | Siddiqui et al. |
| 2011/0303989 A1 | 12/2011 | Chuang et al. |
| 2011/0316084 A1 | 12/2011 | Anderson et al. |
| 2012/0037999 A1 | 2/2012 | Jagannathan et al. |
| 2012/0132998 A1 | 5/2012 | Kwon et al. |
| 2013/0256802 A1 * | 10/2013 | Jagannathan et al. ........ 257/368 |
| 2014/0027859 A1 * | 1/2014 | Gerhardt et al. .............. 257/392 |

FOREIGN PATENT DOCUMENTS

| | | |
|---|---|---|
| JP | 2007128931 | 5/2007 |
| KR | 20030050678 | 6/2003 |

* cited by examiner

SEMICONDUCTOR DEVICE AND METHOD OF FABRICATING THE SAME

This application claims priority from Korean Patent Application No. 10-2012-0114276 filed on Oct. 15, 2012 in the Korean Intellectual Property Office, the disclosure of which is incorporated herein by reference in its entirety.

BACKGROUND

1. Field of Inventive Concepts

Inventive concepts relate to a semiconductor device and a method of fabricating the same.

2. Related Art

As the feature size of metal oxide semiconductor (MOS) transistors is reduced, the dimensions of the gate and the channel formed under the gate have been reduced accordingly. In order to maintain, or increase, the capacitance between the gate and channel, and thereby improve operating characteristics of the transistor, the thickness of a silicon oxide layer, used primarily as a gate insulating layer, has also been diminished. However, thinner gate insulating layers may dramatically increase leakage currents, leading to higher power consumption and reduced device reliability. High dielectric constant materials (also referred to as high-k materials) have been substituted for silicon oxide in the gate insulating layer, allowing increased gate capacitance (and increased performance) without suffering the consequences of the relatively high leakage currents associated with thin silicon dioxide layers. Additionally, because polysilicon has a relatively high resistance, polysilicon gate electrodes may be replaced by metal gate electrodes to further improve performance.

SUMMARY

In an exemplary embodiment in accordance with principles of inventive concepts, a semiconductor device includes a substrate having a first and second regions, an interlayer insulating film formed on the substrate and comprising a first trench which is disposed in the first region and a second trench which is disposed in the second region, a first transistor comprising a first gate insulating layer which is formed on a bottom surface of the first trench and has a first thickness, a reaction prevention layer which is formed on the first gate insulating layer on the bottom surface of the first trench, and a first replacement metal gate structure which is formed on the reaction prevention layer of the first trench to fill the first trench, and a second transistor comprising a second gate insulating layer which is formed in the second trench and has a second thickness smaller than the first thickness and a second replacement metal gate structure which is formed on the second gate insulating layer in the second trench.

In an exemplary embodiment in accordance with principles of inventive concepts a semiconductor device includes a second gate insulating layer is formed along sidewalls and a bottom surface of the second trench, and the first gate insulating layer is formed only on the bottom surface of the first trench.

In an exemplary embodiment in accordance with principles of inventive concepts, a semiconductor device includes a second gate insulating layer that comprises a high-k insulating layer.

In an exemplary embodiment in accordance with principles of inventive concepts, a semiconductor device includes a second replacement metal gate structure that comprises a capping layer formed on the second gate insulating layer, wherein the capping layer comprises TiN and is formed along the sidewalls and bottom surface of the second trench.

In an exemplary embodiment in accordance with principles of inventive concepts, a semiconductor device includes a first gate insulating layer that comprises SiON.

In an exemplary embodiment in accordance with principles of inventive concepts, a semiconductor device includes a reaction prevention layer that comprises TiN.

In an exemplary embodiment in accordance with principles of inventive concepts, a semiconductor device includes a reaction prevention layer and first replacement metal gate structure that directly contact each other.

In an exemplary embodiment in accordance with principles of inventive concepts, a semiconductor device includes a first replacement metal gate structure that comprises a work function adjustment layer formed along the sidewalls and bottom surface of the first trench.

In an exemplary embodiment in accordance with principles of inventive concepts, a semiconductor device includes a work function adjustment layer is a P-type work function adjustment layer, wherein the P-type work function adjustment layer comprises a TiN layer.

In an exemplary embodiment in accordance with principles of inventive concepts, a semiconductor device includes an interlayer insulating film comprising a trench, a high-voltage gate insulating layer formed on a bottom surface of the trench, a reaction prevention layer formed on the high-voltage gate insulating layer on the bottom surface of the trench, and a replacement metal gate structure formed on the reaction prevention layer of the trench to fill the trench.

In an exemplary embodiment in accordance with principles of inventive concepts, a semiconductor device includes a reaction prevention layer that comprises TiN.

In an exemplary embodiment in accordance with principles of inventive concepts, a semiconductor device includes a high-voltage gate insulating layer that comprises SiON.

In an exemplary embodiment in accordance with principles of inventive concepts, a semiconductor device includes a high-voltage gate insulating layer and reaction prevention layer are not formed on sidewalls of a trench.

In an exemplary embodiment in accordance with principles of inventive concepts, a semiconductor device includes a reaction prevention layer and the replacement metal gate structure that directly contact each other.

In an exemplary embodiment in accordance with principles of inventive concepts, a semiconductor device includes a replacement metal gate structure that comprises a work function adjustment layer formed along the sidewalls and bottom surface of the trench.

In an exemplary embodiment in accordance with principles of inventive concepts, a semiconductor device includes an interlayer insulating film comprising a first trench, a gate insulating layer formed on a bottom surface of the trench, a reaction prevention layer formed on the gate insulating layer on the bottom surface of the trench, and a replacement metal gate structure formed on the reaction prevention layer of the trench to fill the trench.

In an exemplary embodiment in accordance with principles of inventive concepts, a semiconductor device includes first and second regions defined in the substrate, the first trench formed in the first region and a second trench formed in the second region, a high-voltage gate insulating layer formed on a bottom surface of the second trench, a reaction prevention layer formed on the high-voltage gate insulating layer on the bottom surface of the second trench, and a replacement metal gate structure formed on the reaction prevention layer of the second trench to fill the trench.

In an exemplary embodiment in accordance with principles of inventive concepts, a semiconductor device includes a first region that comprises a static random access memory region and the second region comprises a logic region.

In an exemplary embodiment in accordance with principles of inventive concepts, a portable electronic device includes a semiconductor device that includes an interlayer insulating film comprising a first trench, a gate insulating layer formed on a bottom surface of the trench, a reaction prevention layer formed on the gate insulating layer on the bottom surface of the trench, and a replacement metal gate structure formed on the reaction prevention layer of the trench to fill the trench.

In an exemplary embodiment in accordance with principles of inventive concepts, a wireless telephone includes a semiconductor device that includes an interlayer insulating film comprising a first trench, a gate insulating layer formed on a bottom surface of the trench, a reaction prevention layer formed on the gate insulating layer on the bottom surface of the trench, and a replacement metal gate structure formed on the reaction prevention layer of the trench to fill the trench.

BRIEF DESCRIPTION OF THE DRAWINGS

The above and other aspects and features of inventive concepts will become more apparent by describing in detail exemplary embodiments thereof with reference to the attached drawings, in which.

DETAILED DESCRIPTION

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
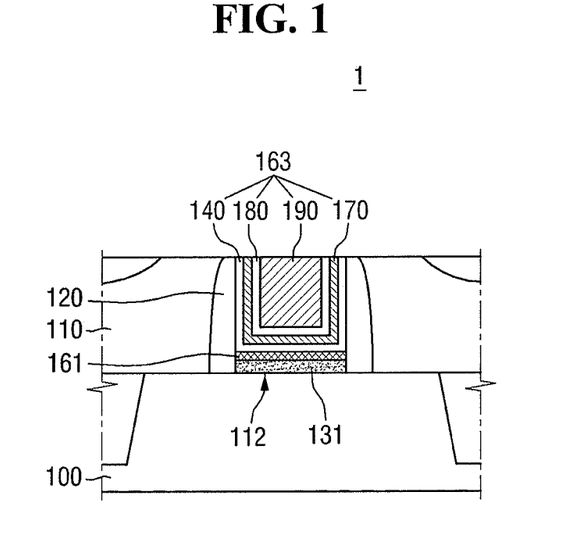
FIG. 1 is a cross-sectional view of a semiconductor device 1 in an exemplary embodiment in accordance with principles of inventive concepts.

FIG. 1 is a cross-sectional view of a semiconductor device 1 in an exemplary embodiment in accordance with principles of inventive concepts. In the exemplary embodiment of FIG. 1, the gate of an NMOS transistor is illustrated as an example, but inventive concepts are not limited thereto. Additionally, although a high-voltage transistor is illustrated in FIG. 1; inventive concepts are not limited thereto.

Semiconductor device 1 in accordance with principles of inventive concepts may include: a substrate 100, an interlayer insulating film 110, which includes a first trench 112, a first gate insulating layer 131 (or a high-voltage gate insulating layer), a reaction prevention layer 161, and a first replacement metal gate structure 163.

A device isolation layer such as shallow trench isolation (STI) may be formed in the substrate 100 to define an active region. The substrate 100 may be made of one or more semiconductor materials selected from the group consisting of Si, Ge, SiGe, GaP, GaAs, SiC, SiGeC, InAs, and InP and may be a silicon-on-insulator (SOI) substrate, for example.

An interlayer insulating film 110 may be formed on the substrate 100 and may include first trench 112. The interlayer insulating film 110 may be formed by stacking two or more insulating layers, for example. Spacers 120 may be formed on sidewalls of the first trench 112. The spacers 120 may include at least one of a nitride layer and an oxynitride layer.

In an exemplary embodiment in accordance with principles of inventive concepts, the first gate insulating layer 131 may be formed on the bottom surface of the first trench 112 but not on the sidewalls of the first trench 112 (that is, the layer 131 does not extend upward along the sidewalls beyond the thickness of the layer 131). As will be described in greater detail in the discussion related to FIGS. 9 and 10, the first gate insulating layer 131 is formed on the substrate 100 before the formation of the interlayer insulating layer 110 and the spacers 120. In an exemplary embodiment in accordance with principles of inventive concepts, the first gate insulating layer 131 may be intended for use in high-voltage transistors and may include, e.g., SiON. The first gate insulating layer 131 may be formed of a material that can withstand a high voltage, for example.

The reaction prevention layer 161 may be formed on the bottom surface of the first trench 112 and the first gate insulating layer 131 but not on the sidewalls of the first trench 112, because, in an exemplary embodiment in accordance with principles of inventive concepts, the reaction prevention layer 161 is formed on the substrate 100 before the formation of the interlayer insulating layer 110, as will be described in greater detail in the description related to FIGS. 9 and 10. The reaction prevention layer 161 may be, but is not limited to, a TiN layer, for example.

The first replacement metal gate structure 163 may include: a first etch stop layer 140, an N-type work function adjustment layer 170, a first adhesion layer 180, and a first metal gate pattern 190, for example. The first replacement metal gate structure 163 shown in FIG. 1 is merely an example, and inventive concepts are not limited thereto.

The first etch stop layer 140 may be conformally formed along the sidewalls and bottom surface of the first trench 112. The first etch stop layer 140 may include at least one of TaN and TiN, or, a sequential stack of a TaN layer and a TiN layer, for example. The first etch stop layer 140 may be used when portions of the N-type work function adjustment layer 170 which are formed in other regions (not shown) are etched. The first etch stop layer 140 may be formed to an appropriate thickness according to the type of a device to be formed. In an exemplary embodiment in accordance with principles of inventive concepts, the etch stop layer 140 formed of a TiN layer may have a thickness of from approximately 5 to 40 Å, and the first etch stop layer 140 formed of a TaN may have a thickness of from approximately 5 to 30 Å.

The N-type work function adjustment layer 170 may be formed on the first etch stop layer 140 inside the first trench 112. The N-type work function adjustment layer 170 may also be conformally formed along the sidewalls and bottom surface of the first trench 112. In accordance with principles of inventive concepts, he N-type work function adjustment layer 170 may control operating characteristics of an N-type transistor by adjusting the work function of the N-type transistor. The N-type work function adjustment layer 170 may be a material selected from the group consisting of TiAl, TiAlN, TaC, TiC, and HfSi. For example, the N-type work function adjustment layer 170 may be a TiAl layer. In accordance with principles of inventive concepts, the N-type work function adjustment layer 170 may have a thickness of from 30 to 120 Å, for example.

The first adhesion layer 180 may be formed on the N-type work function adjustment layer 170 inside the first trench 112. The first adhesion layer 180 may also be conformally formed along the sidewalls and bottom surface of the first trench 112, for example. The first adhesion layer 180 may include at least one of TiN and Ti, or, a sequential stack of a TiN layer and a Ti layer, for example. In accordance with principles of inventive concepts, the TiN layer may have a thickness of from 5 to 100 Å, and the Ti layer may have a thickness of from 5 to 100 Å. The first adhesion layer 180 increases adhesion of the first metal gate pattern 190, which will be formed in a subsequent process.

The first metal gate pattern 190 may be formed on the first adhesion layer 180 inside the first trench 112 to fill the first trench 112, for example, and may be, but is not limited to Al, W, for example. In the exemplary embodiment of semiconductor device 1 in accordance with principles of inventive concepts, the reaction prevention layer 161 is formed on the first gate insulating layer 131. In particular, the reaction prevention layer 161 may be placed between the first insulating layer 131 and a first sacrificial gate 119 (see FIG. 10) in a fabrication process in accordance with principles of inventive concepts. The reaction prevention layer 161 prevents a reaction from occurring between the first gate insulating layer 131 and the first sacrificial gate 119. Such a reaction could generate a reaction material that may remain on the surface of the first gate insulating layer 131 even after the removal of the first sacrificial gate 119 and this reaction material could deteriorate time dependent dielectric breakdown (TDDB) characteristics of the semiconductor device 1. In accordance with principles of inventive concepts, the formation of the reaction prevention layer 161 can improve the TDDB characteristics by preventing generation of the reaction material.

Figure 2:
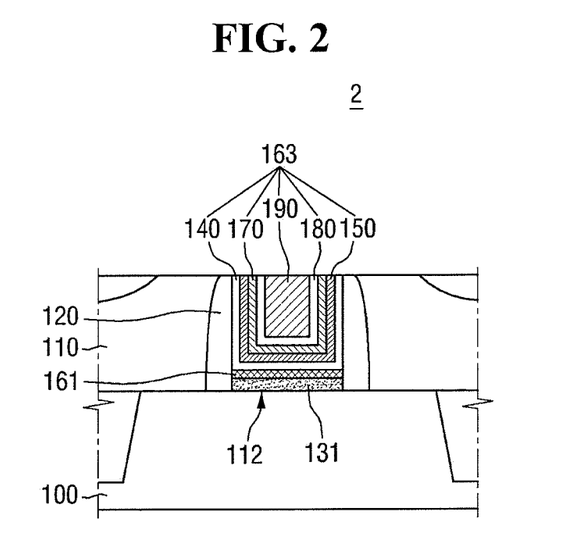
FIG. 2 is a cross-sectional view of a semiconductor device 2 in an exemplary embodiment in accordance with principles of inventive concepts.

FIG. 2 is a cross-sectional view of a semiconductor device 2 in an exemplary embodiment in accordance with principles of inventive concepts. In FIG. 2, the gate of a PMOS transistor is illustrated as an example, but inventive concepts are not limited thereto. For simplicity and clarity of description, the description of elements of the gate of the PMOS transistors which are substantially the same as those of the gate of the NMOS transistor shown in FIG. 1 will be omitted from the discussion related to FIG. 2. Semiconductor device 2 may include: a substrate 100, an interlayer insulating film 110 which includes a first trench 112, a first gate insulating layer 131 (or a high-voltage gate insulating layer), a reaction prevention layer 161, and a first replacement metal gate structure 163.

The first replacement metal gate structure 163 may include a first etch stop layer 140, a P-type work function adjustment layer 150, an N-type work function adjustment layer 170, a first adhesion layer 180, and a first metal gate pattern 190, for example.

The P-type work function adjustment layer 150 may be formed on the first etch stop layer 140 inside the first trench 112 and may be conformally formed along sidewalls and bottom surface of the first trench 112, for example. The P-type work function adjustment layer 150 may control operating characteristics of a P-type transistor by adjusting the work function of the P-type transistor. The P-type work function adjustment layer 150 may be a TiN layer and may have a thickness of from 50 to 100 Å, for example.

The N-type work function adjustment layer 170 may also be conformally formed along the sidewalls and bottom surface of the first trench 112. In an exemplary embodiment in accordance with principles of inventive concepts, in order to reduce the number of photo process steps, the N-type work function adjustment layer 170 may be left intact, unless that is, it significantly deteriorates operating characteristics of the P-type transistor, in which case, it will be removed.

Figure 3:
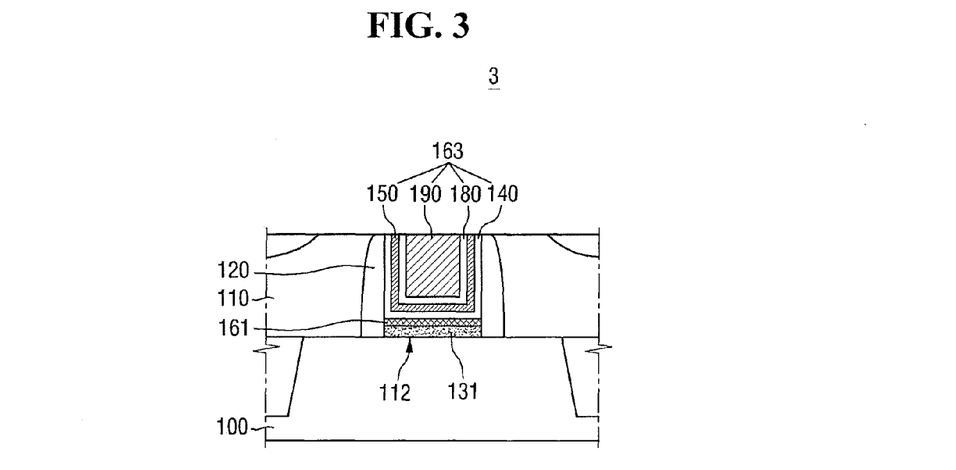
FIG. 3 is a cross-sectional view of a semiconductor device 3 in an exemplary embodiment in accordance with principles of inventive concepts.

FIG. 3 is a cross-sectional view of a semiconductor device 3 in an exemplary embodiment in accordance with principles of inventive concepts. For simplicity and clarity of description, the description of elements which are substantially the same as those of FIG. 2 will be omitted from the discussion related to FIG. 3. In accordance with principles of inventive concepts, semiconductor device 3 may not include an N-type work function adjustment layer 170 (see FIG. 2). As described above, if the N-type work function adjustment layer 170 does not significantly deteriorate operating characteristics of a P-type transistor, it may be left intact within the P-type transistor. However, the N-type work function adjustment layer 170 may be removed in order to maximize the operating characteristics of the P-type transistor.

Figure 4:
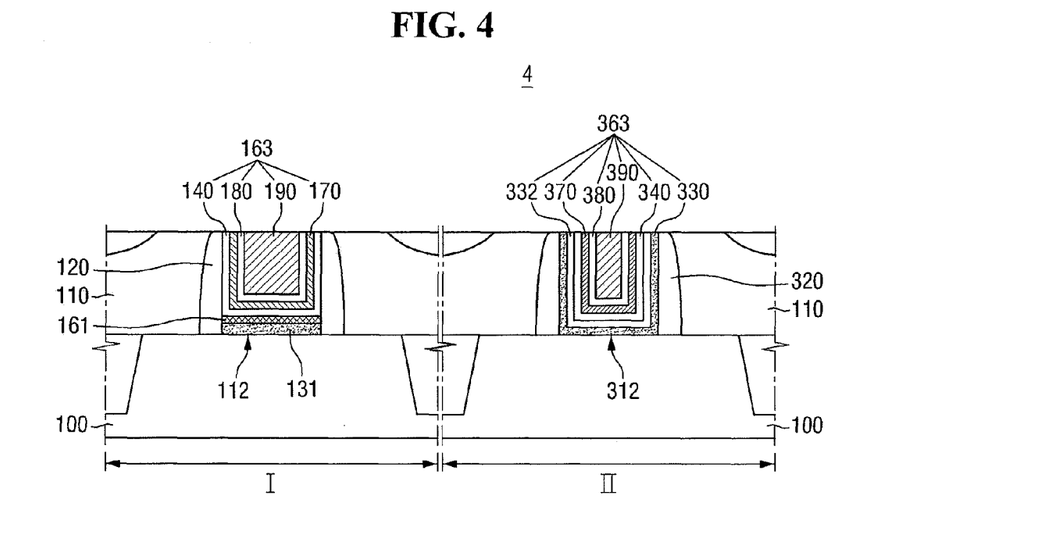
FIG. 4 is a cross-sectional view of a semiconductor device 4 in an exemplary embodiment in accordance with principles of inventive concepts.

FIG. 4 is a cross-sectional view of a semiconductor device 4 in an exemplary embodiment in accordance with principles of inventive concepts. For simplicity and clarity of description, the following description will focus on differences from the embodiment of FIG. 1. In accordance with principles of inventive concepts, in semiconductor device 4 a first region I and a second region II may be defined in a substrate 100. A regular voltage transistor may be formed in the second region II, and a high-voltage transistor may be formed in the first region I. In FIG. 4, NMOS transistors are formed in both the first region I and the second region II. The high-voltage transistor formed in the first region I may be a high-voltage transistor such as semiconductor device 1 described in the discussion related to FIG. 1.

The regular voltage transistor formed in the second region II may include a second trench 312 formed in an interlayer insulating film 110, a second gate insulating layer 330, and a second replacement metal gate structure 363. The second gate insulating layer 330 may be conformally formed along sidewalls and bottom surface of the second trench 312, for example. The second gate insulating layer 330 may include a high-k insulating layer having a higher dielectric constant than a silicon oxide layer and may include a material selected from the group consisting of HfO2, ZrO2, Ta2O5, TiO2, SrTiO3, and (Ba,Sr)TiO3, for example. The second gate insulating layer 330 may be formed to an appropriate thickness according to the type of a device to be formed. Additionally, in accordance with principles of inventive concepts, the second gate insulating layer 330 may be thinner than a first gate insulating layer 131 (a high-voltage gate insulating layer). Because the first gate insulating layer 131 should be able to withstand a high voltage, it may be relatively thicker than the second gate insulating layer 330, for example.

In an exemplary embodiment in accordance with principles of inventive concepts, the second replacement metal gate structure 363 may include: a capping layer 332, a second etch stop layer 340, an N-type work function adjustment layer 370, a second adhesion layer 380, and a second metal gate pattern 390, for example.

The capping layer 332 may be formed on the second gate insulating layer 330 inside the second trench 312. The capping layer 332 may be conformally formed along the sidewalls and bottom surface of the second trench 312 and may be a TiN layer, for example. An annealing process may be employed to stabilize the second gate insulating layer 330. In the annealing process, the capping layer 332 formed on the second gate insulating layer 330 may protect the second gate insulating layer 330.

The second etch stop layer 340 may be formed on the capping layer 332 inside the second trench 312. The second etch stop layer 340 may be conformally formed along the sidewalls and bottom surface of the second trench 312 and may include at least one of TaN and TiN or a sequential stack of a TaN layer and a TiN layer, for example. The second etch stop layer 340 may be used when portions of the N-type work function adjustment layer 370 which are formed in other areas (not shown) are etched. The second etch stop layer 340 may be formed to an appropriate thickness according to the type of a device to be formed.

In accordance with principles of inventive concepts, the N-type work function adjustment layer 370 may be formed on the second etch stop layer 340 inside the second trench 312. The N-type work function adjustment layer 370 may also be conformally formed along the sidewalls and bottom surface of the second trench 312. The N-type work function adjustment layer 370 may control operating characteristics of an N-type transistor by adjusting the work function of the N-type transistor and may be of a material selected from the group consisting of TiAl, TiAlN, TaC, TiC, and HfSi. For example, the N-type work function adjustment layer 370 may be a TiAl layer.

The second adhesion layer 380 may be formed on the N-type work function adjustment layer 370 inside the second trench 312. The second adhesion layer 380 may also be conformally formed along the sidewalls and bottom surface of the second trench 312 and may include at least one of TiN and Ti, or, may include a sequential stack of a TiN layer and a Ti layer. in accordance with principles of inventive concepts, the second adhesion layer 380 increases adhesion of the second metal gate pattern 390 which will be formed in a subsequent process.

The second metal gate pattern 390 may be formed on the second adhesion layer 380 inside the second trench 312 to fill the second trench 312 and may be formed of Al, or W, for example.

In summary, in exemplary embodiments in accordance with principles of inventive concepts, the second gate insulating layer 330 of the regular voltage transistor disposed in the second region II is formed along the sidewalls and bottom surface of the second trench 312, but the first gate insulating layer 131 of the high-voltage transistor disposed in the first region I is formed only on the bottom surface of first trench 112.

In an exemplary embodiment of a high-voltage transistor in accordance with principles of inventive concepts, a reaction prevention layer 161 and a first replacement metal gate structure 163 directly contact each other. That is, no insulating layer (e.g., a high-k insulating layer) is interposed between the reaction prevention layer 161 and the first replacement metal gate structure 163. Additionally, the high-voltage transistor may include the reaction prevention layer 161, but the regular voltage transistor may not include a reaction prevention layer.

As described above, the reaction prevention layer 161 may be a TiN layer and may be formed only on the bottom surface of the first trench 112. In this respect, the reaction prevention layer 161 may differ from a first etch stop layer 141 and a P-type work function adjustment layer 150, which are formed along sidewalls and the bottom surface of the first trench 112, and from the capping layer 332 and the second etch stop layer 340, which are formed along the sidewalls and bottom surface of the second trench 312.

Although not shown in the drawings, in accordance with principles of inventive concepts, any one of the three high-voltage transistors described above with reference to FIGS. 1 through 3 and any one of an N-type regular voltage transistor and a P-type regular voltage transistor may be formed on the same substrate.

Figure 5:
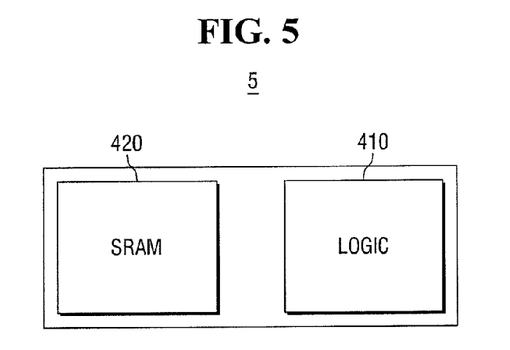
FIG. 5 is a diagram illustrating a semiconductor device 5 in an exemplary embodiment in accordance with principles of inventive concepts.

FIG. 5 is a diagram illustrating a semiconductor device 5 in an exemplary embodiment in accordance with principles of inventive concepts. The semiconductor device 5 may include a logic region 410 and a static random access memory (SRAM) region 420, for example. A high-voltage transistor such as those described above with reference to FIGS. 1 through 4 may be included in logic region 410 but not in the SRAM region 420, for example.

In the exemplary embodiment in accordance with principles of inventive concepts of FIG. 5, the logic region 410 and the SRAM region 420 are illustrated as an example, but inventive concepts may also be applied to the logic region 410 and a region in which another memory (e.g., a DRAM, an MRAM, an RRAM, a PRAM, etc.) is formed, for example.

Figure 6:
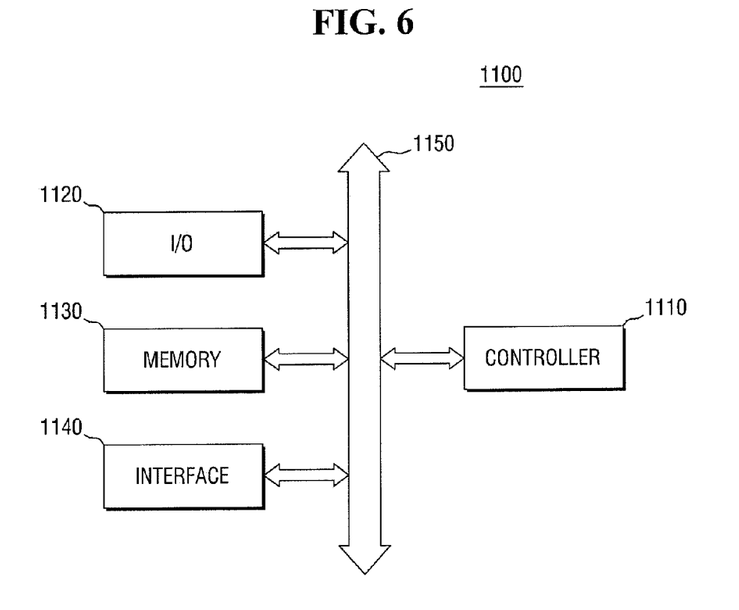
FIG. 6 is a block diagram of an electronic system 1100 including semiconductor devices according to exemplary embodiments of inventive concepts.

FIG. 6 is a block diagram of an exemplary electronic system 1100 in accordance with principles of inventive concepts that includes semiconductor devices according to principles of inventive concepts. The electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an exemplary embodiment, the interface 1140 may include an antenna or a wired or wireless transceiver. The electronic system 1100 may include an operating memory for improving the operation of the controller 1110, and may also include a high-speed dynamic random access memory (DRAM) or SRAM. Fin field effect transistors (FinFETs) in accordance with principles of inventive concepts may be provided in the memory device 1130 or in the controller 1110 or the I/O device 1120, for example.

The electronic system 1100 may be applied to nearly all types of electronic products, or portable electronic devices, capable of transmitting or receiving information in a wireless environment, such as a personal digital assistant (PDA), a portable computer, a web tablet, a wireless phone, a mobile phone, a digital music player, a memory card, for example.

Figure 7:
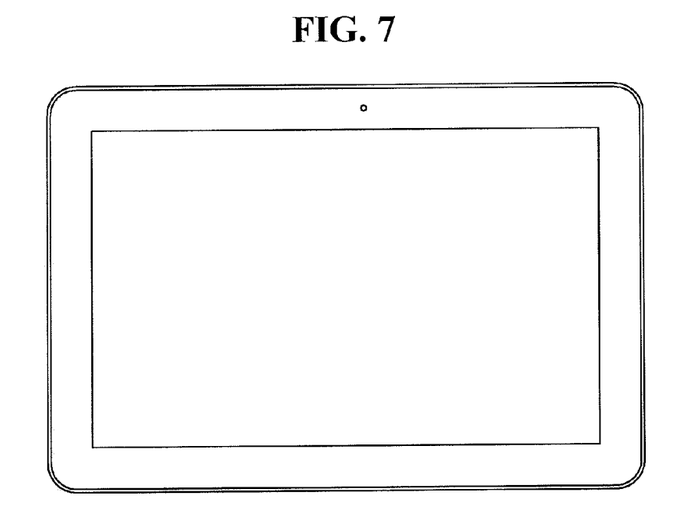
FIGS. 7 and 8 are diagrams illustrating examples of a semiconductor system to which semiconductor devices according to exemplary embodiments of inventive concepts can be applied.
Figure 8:
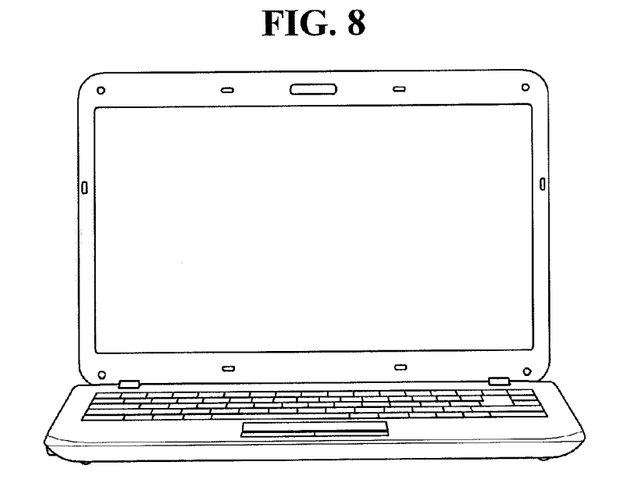

FIGS. 7 and 8 are diagrams illustrating examples of a semiconductor system to which semiconductor devices in accordance with principles of inventive concepts may be applied. In particular, FIG. 7 illustrates a tablet personal computer (PC), and FIG. 8 illustrates a laptop computer. At least one of the semiconductor devices 1 through 5 in accordance with principles of inventive concepts may be used in a tablet PC or a laptop computer. Semiconductor devices in accordance with principles of inventive concepts may also be applied to various integrated circuit (IC) devices other than those set forth herein.

An exemplary method of fabricating a semiconductor device in accordance with principles of inventive concepts will be described in the discussion related to FIGS. 9 through 12 and 1. FIGS. 9 through 12 illustrate steps of a method of fabricating a semiconductor device in accordance with principles of inventive concepts.

Figure 9:
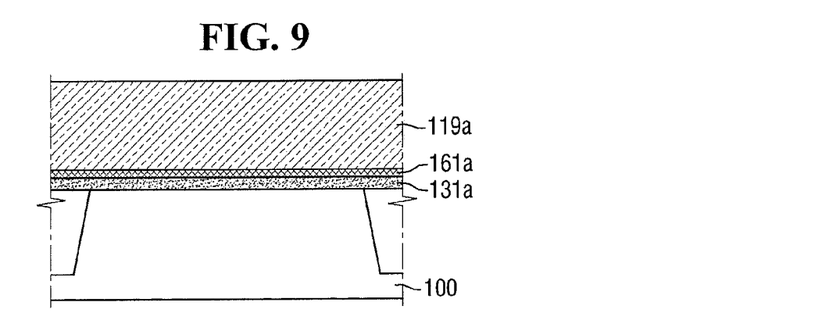
FIGS. 9 through 12 are views illustrating steps of a method of fabricating a semiconductor device in an exemplary embodiment in accordance with principles of inventive concepts.

Referring to FIG. 9, an insulating layer 131a, a conductive layer 161a, and a silicon layer 119a may be sequentially formed on a substrate 100. The insulating layer 131a may be, for example, a SiON layer, and the conductive layer 161a may be, for example, a TiN layer.

Figure 10:
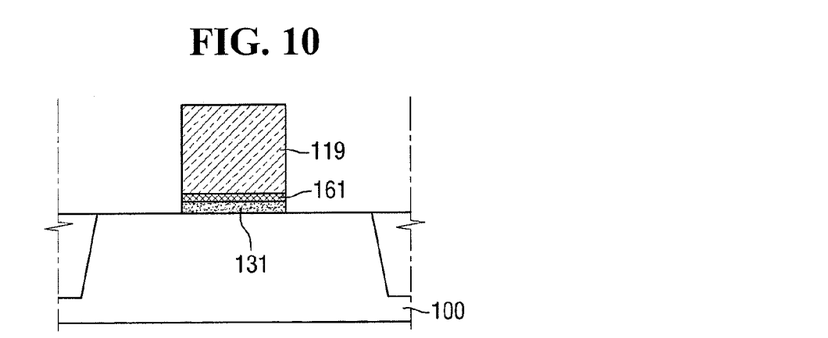

Referring to FIG. 10, the silicon layer 119a, the conductive layer 161a and the insulating layer 131a may be etched to complete a first sacrificial gate 119, a reaction prevention layer 161, and a first gate insulating layer 131. The silicon layer 119a, the conductive layer 161a, and the insulating layer 131a may be etched using, for example, a dry-etching process.

Figure 11:
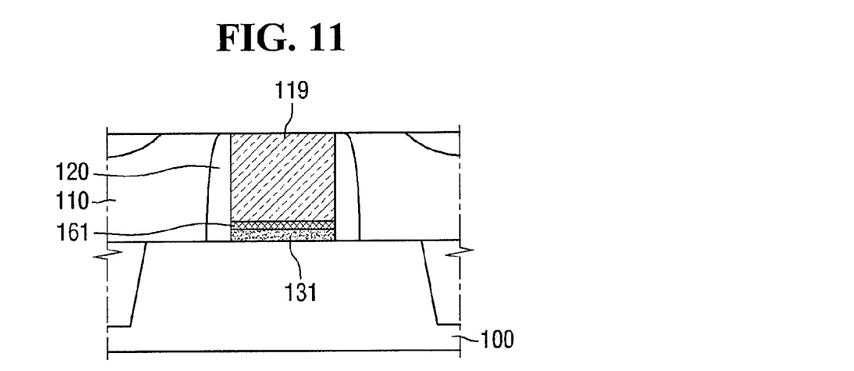

Referring to FIG. 11, spacers 120 and an interlayer insulating film 110 may be formed around the first gate insulating layer 131, the reaction prevention layer 161, and the first sacrificial gate 119. In particular, a spacer insulating layer may be formed on the substrate 100, the first gate insulating layer 131, the reaction prevention layer 161, and the first sacrificial gate 119 and then etched back to complete the spacers 120, for example.

Thereafter, an interlayer insulating layer may be formed to completely cover the first gate insulating layer 131, the reaction prevention layer 161, and the first sacrificial gate 119 and then planarized to complete the interlayer insulating layer 110 which exposes a top surface of the first sacrificial gate 119.

Figure 12:
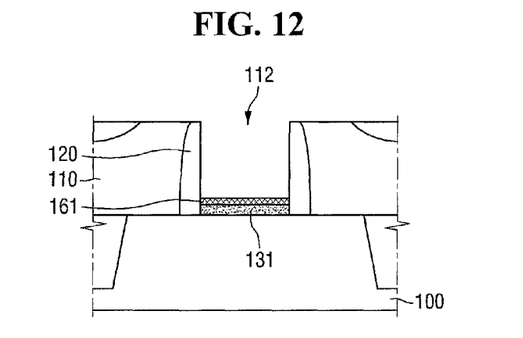

Referring to FIG. 12, the reaction prevention layer 161 may be exposed by removing the first sacrificial gate 119. In particular, the reaction prevention layer 161 may be disposed between the first gate insulating layer 131 and the first sacrificial gate 119 as described above. The reaction prevention layer 161 prevents a reaction between the first gate insulating layer 131 and the first sacrificial gate 119 and thereby prevents the formation of reaction material that may negatively affect TDDB characteristics.

Referring to FIG. 1, a first replacement metal gate structure 163 may be formed on the reaction prevention layer 161. The first replacement metal gate structure 163 may include a first etch stop layer 140, an N-type work function adjustment layer 170, a first adhesion layer 180, and a first metal gate pattern 190, for example.

Hereinafter, a method of fabricating a semiconductor device in an exemplary embodiment in accordance with principles of inventive concepts will be described with reference to FIGS. 13 through 18 and 4. FIGS. 13 through 18 are views illustrating steps of a method of fabricating a semiconductor device in an exemplary embodiment in accordance with principles of inventive concepts.

Figure 13:
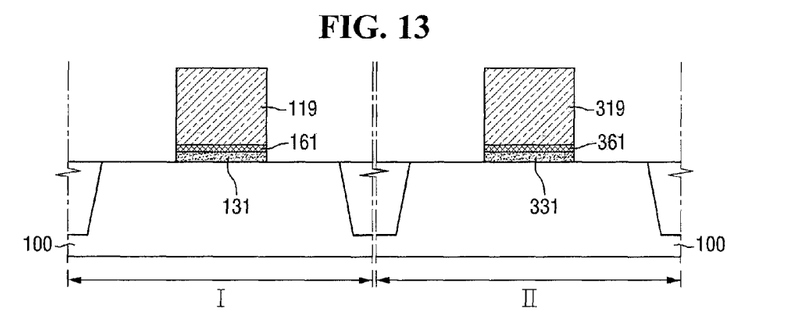
FIGS. 13 through 18 are views illustrating steps of a method of fabricating a semiconductor device in an exemplary embodiment in accordance with principles of inventive concepts.

Referring to FIG. 13, a substrate 100 having a first region I and a second region II defined is provided. A first gate insulating layer 131, a first reaction prevention layer 161 and a first sacrificial gate 119 may be formed in the first region I, and a third gate insulating layer 331, a second reaction prevention layer 161 and a second sacrificial gate 319 may be formed in the second region II. The first gate insulating layer 131 and the third gate insulating layer 331 are intended for use in high-voltage transistors and may be, for example, SiON layers.

Figure 14:
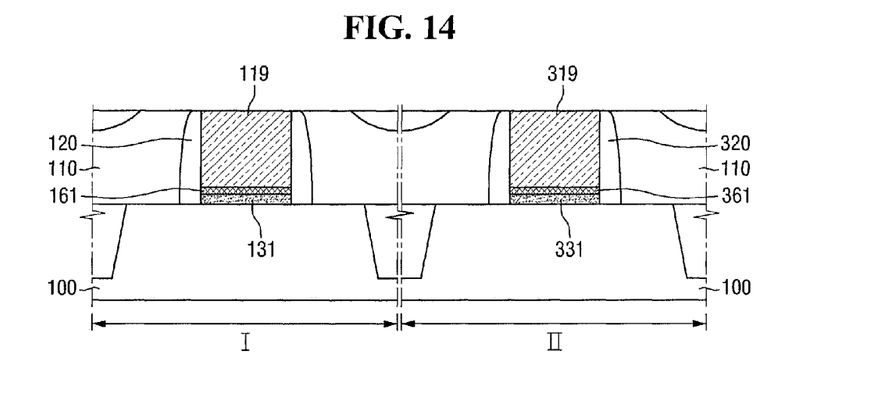

Referring to FIG. 14, in accordance with principles of inventive concepts, spacers 120 and an interlayer insulating film 110 may be formed around the first gate insulating layer 131, the first reaction prevention layer 161, the first sacrificial gate 119, the third gate insulating layer 331, the second reaction prevention layer 161, and the second sacrificial gate 319, for example.

Figure 15:
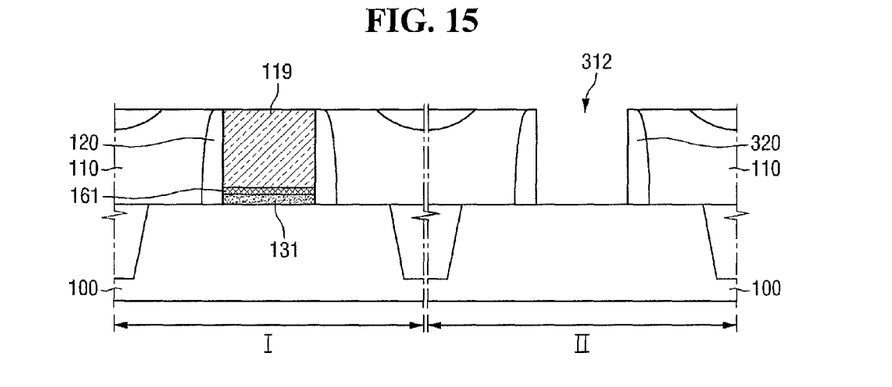

Referring to FIG. 15, a mask pattern may be formed on the interlayer insulating film 110 to cover the first region I and expose the second region II.

The third gate insulating layer 331, the second reaction prevention layer 161 and the second sacrificial gate 319 may be removed using the mask pattern.

Figure 16:
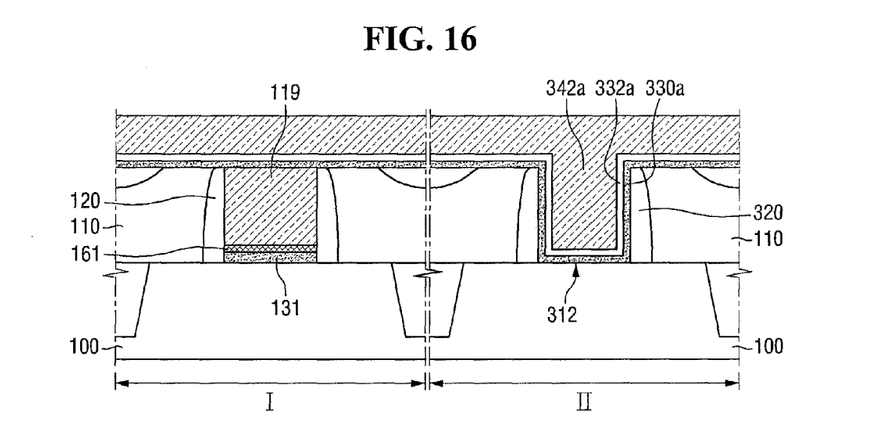

Referring to FIG. 16, a high-k insulating layer 330a, a capping layer 332a, and polysilicon 342a are sequentially formed on the substrate 100 of the second region II.

That is, the high-k insulating layer 330a and the capping layer 332a are formed along sidewalls and a bottom surface of a second trench 312 and a top surface of the interlayer insulating film 110. In addition, the polysilicon 342a is formed on the top surface of the interlayer insulating film 110 to fill the second trench 312.

Then, an annealing process may be performed to stabilize the high-k insulating layer 330a. In the annealing process, the capping layer 332a and the polysilicon 342a may protect the high-k insulating layer 330a, for example.

Figure 17:
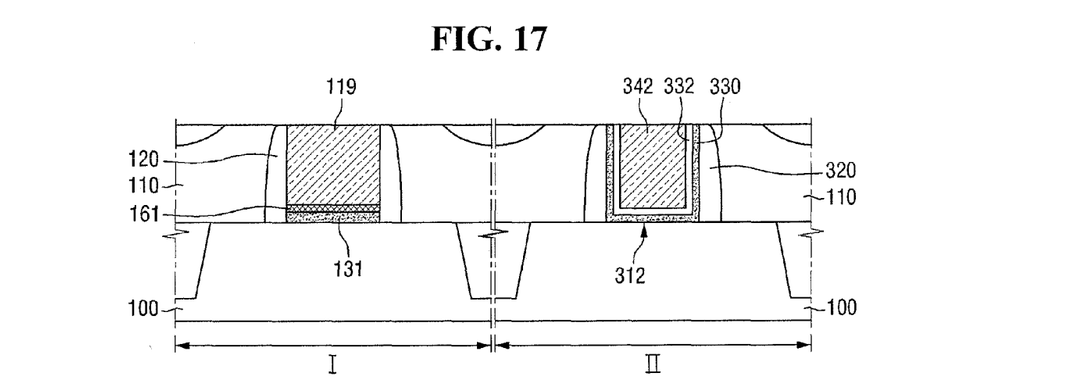

Referring to FIG. 17, the polysilicon 342a, the capping layer 332a, and the high-k insulating layer 330a disposed on the top surface of the interlayer insulating film 110 may be partially removed by a planarization process. As a result, a second gate insulating layer 330, a capping layer 332, and a polysilicon pattern 342 are completed. The first sacrificial gate 119 and the polysilicon pattern 342 are exposed.

Figure 18:
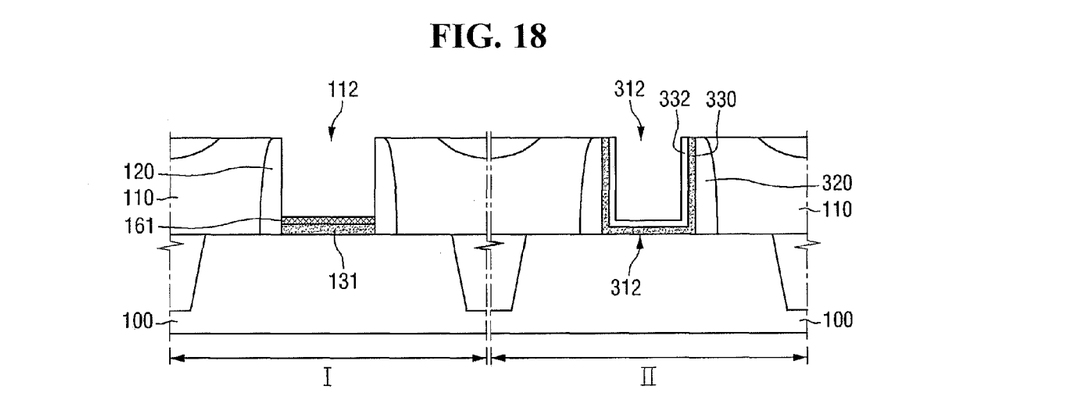

Referring to FIG. 18, the first sacrificial gate 119 of the first region I and the polysilicon pattern 342 of the second region II may be removed. That is, in accordance with principles of inventive concepts, the reaction prevention layer 161 in the first region I is exposed, and the capping layer 332 in the second region II is exposed.

Referring back to FIG. 4, a first replacement metal gate structure 163 may be formed on the reaction prevention layer 161, and a second replacement metal gate structure 363 may be formed on the capping layer 332.

The structures of the first replacement metal gate structure 163 and the second replacement metal gate structure 363 can be altered, for example.

While exemplary embodiments of inventive concepts have been particularly shown and described, it will be understood by those of ordinary skill in the art that various changes in form and details may be made therein without departing from the spirit and scope of inventive concepts, as defined by the following claims. It is therefore desired that the present exemplary embodiments be considered in all respects as illustrative and not restrictive, reference being made to the appended claims rather than the foregoing description to indicate the scope of inventive concepts.

What is claimed is:

1. A semiconductor device comprising:
   a substrate having a first and second regions;
   an interlayer insulating film formed on the substrate and comprising a first trench which is disposed in the first region and a second trench which is disposed in the second region;
   a first transistor comprising a first gate insulating layer which is formed on a bottom surface of the first trench and has a first thickness, a sacrificial gate reaction prevention layer which is formed on the first gate insulating layer on the bottom surface of the first trench, and a first replacement metal gate structure which is formed on the sacrificial gate reaction prevention layer of the first trench to fill the first trench; and
   a second transistor comprising a second gate insulating layer which is formed in the second trench and has a second thickness smaller than the first thickness and a second replacement metal gate structure which is formed on the second gate insulating layer in the second trench.

2. The semiconductor device of claim 1, wherein the second gate insulating layer is formed along sidewalls and a bottom surface of the second trench, and the first gate insulating layer is formed only on the bottom surface of the first trench.

3. The semiconductor device of claim 1, wherein the second gate insulating layer comprises a high-k insulating layer.

4. The semiconductor device of claim 3, wherein the second replacement metal gate structure comprises a capping layer formed on the second gate insulating layer, wherein the capping layer comprises TiN and is formed along the sidewalls and bottom surface of the second trench.

5. The semiconductor device of claim 3, wherein the first gate insulating layer comprises SiON.

6. The semiconductor device of claim 1, wherein the reaction prevention layer comprises TiN.

7. The semiconductor device of claim 1, wherein the reaction prevention layer and the first replacement metal gate structure directly contact each other.

8. The semiconductor device of claim 1, wherein the first replacement metal gate structure comprises a work function adjustment layer formed along the sidewalls and bottom surface of the first trench.

9. The semiconductor device of claim 8, wherein the work function adjustment layer is a P-type work function adjustment layer, wherein the P-type work function adjustment layer comprises a TiN layer.

10. A semiconductor device comprising:
an interlayer insulating film comprising a trench;
a high-voltage gate insulating layer formed on a bottom surface of the trench;
a sacrificial gate reaction prevention layer formed on the high-voltage gate insulating layer on the bottom surface of the trench; and
a replacement metal gate structure formed on the reaction prevention layer of the trench to fill the trench.

11. The semiconductor device of claim 10, wherein the reaction prevention layer comprises TiN.

12. The semiconductor device of claim 10, wherein the high-voltage gate insulating layer comprises SiON.

13. The semiconductor device of claim 10, wherein the high-voltage gate insulating layer and the reaction prevention layer are not formed on sidewalls of the trench.

14. The semiconductor device of claim 10, wherein the reaction prevention layer and the replacement metal gate structure directly contact each other.

15. The semiconductor device of claim 10, wherein the replacement metal gate structure comprises a work function adjustment layer formed along the sidewalls and bottom surface of the trench.

16. A semiconductor device, comprising:
an interlayer insulating film comprising a first trench;
a gate insulating layer formed on a bottom surface of the trench;
a sacrificial gate reaction prevention layer formed on the gate insulating layer on the bottom surface of the trench; and
a replacement metal gate structure formed on the reaction prevention layer of the trench to fill the trench.

17. The semiconductor device of claim 16, wherein the semiconductor device further comprises:
first and second regions defined in the substrate;
the first trench formed in the first region and a second trench formed in the second region;
a high-voltage gate insulating layer formed on a bottom surface of the second trench;
a reaction prevention layer formed on the high-voltage gate insulating layer on the bottom surface of the second trench; and
a replacement metal gate structure formed on the reaction prevention layer of the second trench to fill the trench.

18. The semiconductor device of claim 17 wherein the first region comprises a static random access memory region and the second region comprises a logic region.

* * * * *